United States Patent [19]

Bayer et al.

[11] 4,247,781
[45] Jan. 27, 1981

[54] COOLED TARGET DISC FOR HIGH CURRENT ION IMPLANTATION METHOD AND APPARATUS

[75] Inventors: Erich H. Bayer, Mahopac; John R. Kranik, Poughkeepsie; Wolfgang F. Mueller, Wappingers Falls, all of N.Y.

[73] Assignee: International Business Machines Corporation, Armonk, N.Y.

[21] Appl. No.: 53,443

[22] Filed: Jun. 29, 1979

[51] Int. Cl.³ .......................................... H01J 37/00
[52] U.S. Cl. .............................. 250/492 A; 250/398; 250/443
[58] Field of Search ............... 250/492 A, 492 B, 398, 250/443, 440, 420; 219/121 EB, 121 EM

[56] References Cited
U.S. PATENT DOCUMENTS

| | | |
|---|---|---|
| 3,441,000 | 4/1969 | Burd et al. |
| 3,983,402 | 9/1976 | Arndt et al. ............... 250/492 A |
| 3,993,018 | 11/1976 | Kranik et al. |
| 4,011,449 | 3/1977 | Ko et al. |
| 4,044,266 | 8/1977 | Jespersen et al. |
| 4,063,103 | 12/1977 | Sumi ............................ 250/492 A |
| 4,118,630 | 10/1978 | McKenna et al. .......... 250/492 A |
| 4,135,097 | 1/1979 | Formeris et al. |
| 4,155,011 | 5/1979 | Märk ............................ 250/492 A |

*Primary Examiner*—Bruce C. Anderson
*Attorney, Agent, or Firm*—John A. Jordan

[57] ABSTRACT

A rotating target ion bombard or implant apparatus with an arrangement for cooling the target. The cooling arrangement utilizes a pattern of air openings or passages and air fins. The pattern of air openings are positioned concentric to the disc hub and act to separate the hub region of the disc from the outer target or work region. The air openings function to both reduce the conductive cross-section between the hub region and outer work region of the disc and permit air to pass from the implant or bombard side to the back surface thereof. The air fins are provided on the back surface of the disc to draw air through the openings when rotating. Cooling is achieved by rotating in atmosphere during the load/unload cycle of operation. Reduction of the conductive cross-section between work region and hub region reduces heat transfer to the ferrofluidic feedthrough means coupled to the hub region thereby increasing the ferrofluidic feedthrough means lifetime.

10 Claims, 7 Drawing Figures

COOLED TARGET DISC FOR HIGH CURRENT ION IMPLANTATION METHOD AND APPARATUS

BACKGROUND OF THE INVENTION

1. Field of the Invention

The present invention relates to an ion bombardment or implantation method and apparatus and, more particularly, to a high current ion bombardment or implantation method and apparatus utilizing a rotating disc arranged to operate in a cooled mode.

Ion implantation methods and apparatus are of rapidly increasing importance to the fabrication of integrated circuits, particularly to the implantation of doping impurities and the like in the fabrication of FET and bipolar integrated circuits. In these circuit technologies, there is also an increasing requirement for high doses of impurities to be achieved in a relatively low cycle time. Although relatively high doses of impurities may be achieved over a relatively short period of time by increasing implant currents, one of the difficulties recently encountered in using high implant currents is the generation of excessive heat in the target disc.

The problem of target disc heat generated by high currents is compounded by the fact that the disc undergoes a heat buildup from cycle to cycle whereby, after a number of processing runs have been made, the target temperature is prohibitively high requiring machine shutdown for cooling purposes.

In addition to necessitating machine shutdown for cooling purposes, the heat buildup in the target also causes the life of the ferrofluidic feedthrough device used to couple the target to the driving motor to be substantially reduced. As a result, not only is machine shutdown necessitated for purposes of cooling the target, but also for purposes of periodically replacing the ferrofluidic feedthrough device. In either event, the down time of the ion implant apparatus due to heat buildup is substantial.

2. Description of the Problem and Prior Art

Although the prior art has addressed the problems incident the use of high implant currents with regard to potential charge buildup due to the accumulation of positive ions on the disc target, the problems due to the accumulated buildup of heat in the target have not, heretofore, been adequately addressed. For a solution to the charge buildup problem on the target disc, reference is made to U.S. Pat. No. 4,118,630 to McKenna et al, entitled "Ion Implantation Apparatus with a Cooled Structure Controlling the Surface Potential of a Target Surface", filed May 5, 1977, and assigned to the assignee of the present invention. It should be noted, that in the McKenna et al solution to the charge buildup problem, McKenna et al employ an electron source adjacent the target which source employs cooling means to maintain the temperature of the source below that of the target disc.

The cooling means comprises cooling conduits, through which pass a coolant such as compressed air or a fluorocarbon coolant. It is clear that such cooling means do not act to, nor are they intended to act to, cool the target disc. Basically, the cooling means of McKenna et al are used to cool a wall positioned between the electrons source and target, which wall is interposed to prevent the electron source from heating the target. Thus, McKenna et al, in attempting to solve the charge buildup problem by utilizing an electron source to neutralize the charges, also find it necessary to take steps to prevent the target from further heating up due to electrons from the electron source impinging upon the target.

For a further description of the manner in which means, such as a wall, or the like, may be positioned between the target disc and the electron source for thereby inhibiting direct rectilinear radiations between the target and source and, therefore, the heating of the target from such source, reference is made to U.S. Pat. No. 4,135,097 to Forneris et al entitled "Ion Implantation Apparatus for Controlling the Surface Potential of a Target Surface", filed May 5, 1977, and assigned to the assignee of the present invention. For a typical example of measuring apparatus reference is made to U.S. Pat. No. 4,011,449 to Ko et al entitled "Apparatus for Measuring the Beam Current of Charged Particle Beam", filed Nov. 5, 1975, and assigned to the assignee of the present invention.

SUMMARY OF THE INVENTION

It is, therefore, an object of the present invention to provide an improved ion bombardment and implantation method and apparatus.

It is a further object of the present invention to provide an ion beam bombardment and implantation method and apparatus in which the heat buildup in the target disc is minimized.

It is yet a further object of the present invention to provide an ion beam bombardment or implantation method and apparatus in which ion beam currents may be utilized without the adverse affect of high heat being generated in the target disc.

It is still yet a further object of the present invention to provide an ion beam bombardment or implantation or method and apparatus which permits high impurity dosage to be implanted in semiconductor devices by utilizing high beam currents over relatively short cycle times.

It is another object of the present invention to provide an ion beam bombardment or implantation manufacturing apparatus which permits the implantation of doping impurities in semiconductor circuits and devices with a relatively high throughput.

It is still another object of the present invention to provide an ion beam bombardment or implantation manufacturing apparatus which has high throughput and yet fabricates semiconductor circuits and devices with relatively high quality and yield.

It is yet still another object of the present invention to provide an ion beam bombardment or implantation method and apparatus which utilizes a rotating target disc with cooling means which act to reduce the "down time" caused by part replacement and cooling time.

In accordance with the principles of the present invention, an improved ion beam bombardment and implantation method and apparatus is provided which acts to increase the throughput in bombardment and implantation processes by overcoming heat buildup which typically causes the apparatus to be shut down.

This is achieved by employing a rotating target disc arrangement wherein the disc utilizes a series of air openings to separate the hub region of the disc from the outer target or work surface region upon which bombardment and implantation occurs. Upon the disc surface opposing the work surface, a series of air fins are provided running from the openings to the outer disc periphery. The openings separating the inner hub region from the outer work surface region act to reduce the conductive cross-section between these regions. Similarly, the openings act to provide a path through which air may pass upon normal rotation of the disc, such that the air is drawn through the holes from the front bombard or implant side of the disc and is thrown to the outer periphery of the disc over the back surface thereof so as to thereby cool said disc.

The openings thus act to reduce heat transfer to the hub region and therefore to ferrofluidic drive means used to drive the disc during ion bombardment and implantation. In addition, the heat generated in the outer disc region during ion bombardment and implantation runs is prevented from buildup over successive cycles by causing the disc to rotate in atmosphere before unloading and reloading wafers, or the like.

BRIEF DESCRIPTION OF THE DRAWINGS

FIG. 6 shows a cut-away view of a portion of the target disc of FIGS. 3 and 4 arranged to depict a typical nest arrangement used to hold the semiconductor wafers, or the like.

DESCRIPTION OF THE PREFERRED EMBODIMENTS

Figure 1:
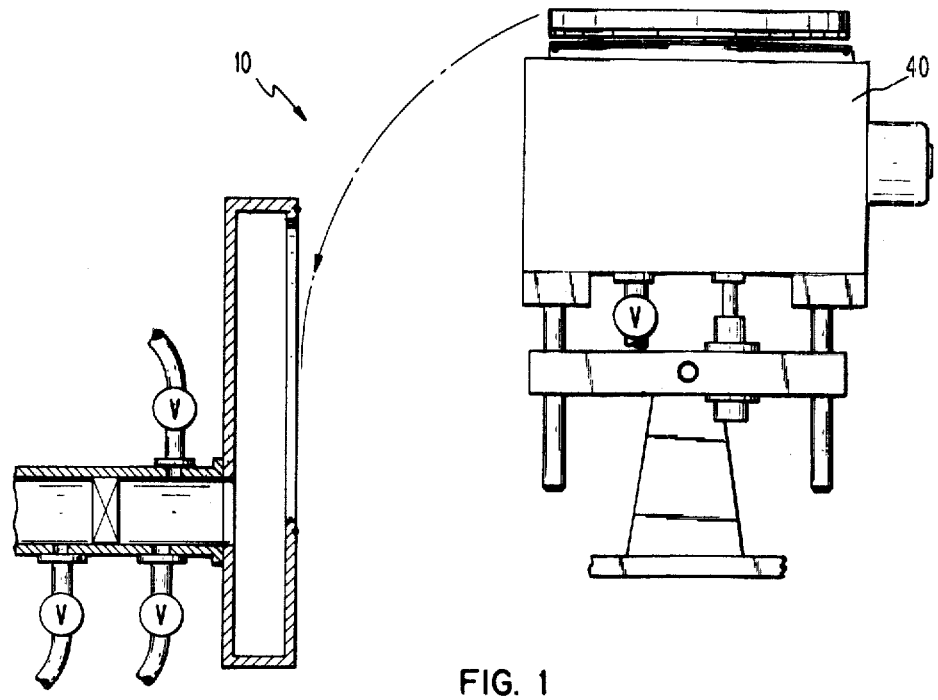
FIG. 1 shows a side view of an ion bombardment and implantation apparatus, arranged in accordance with the principles of the present invention, to function in a cooling mode during the load/unload condition of operation.
Figure 2:
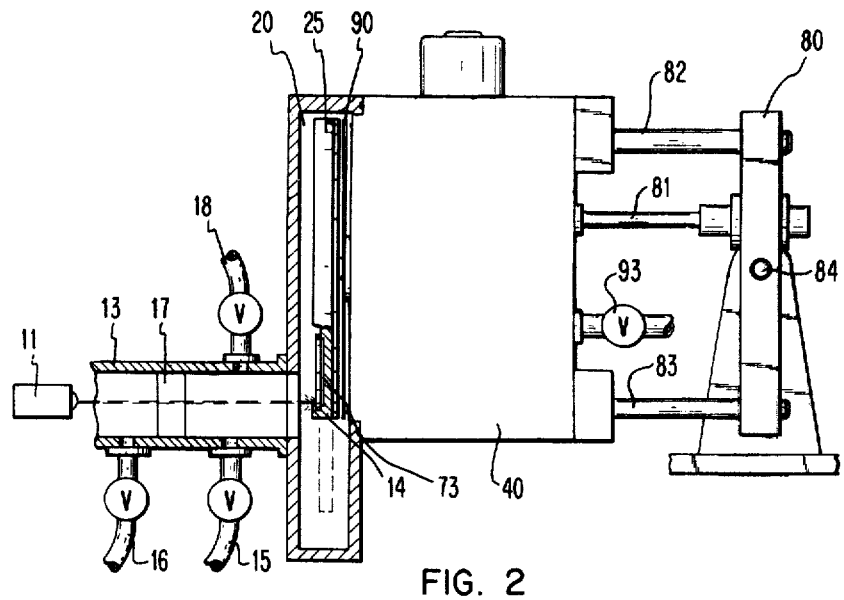
FIG. 2 shows the ion bombardment and implantation apparatus, arranged in accordance with the principles of the present invention, to function in the ion implant and bombard condition.

Referring now to the drawings, and in particular FIGS. 1 and 2 thereof, there is shown a typical embodiment of an ion bombardment or implantation apparatus arranged to operate using the rotating target disc, in accordance with the principles of the present invention. A detailed description of the overall manner in which such apparatus operate may be found by reference to U.S. Pat. No. 3,983,402 to Arndt, Jr., et al entitled "Ion Implantation Apparatus", filed Sept. 28, 1976, and assigned to the assignee of the present invention. For an understanding of the apparatus sufficient to explain the manner in which the rotating target disc with air openings and cooling fins operate in accordance with the present invention, a brief description of the apparatus of FIGS. 1 and 2 and its general operation will be provided, and then a more detailed description will follow relative to FIGS. 3-7 showing the particular manner in which the disc operates.

The apparatus 10 includes an ion source 11 which typically acts to provide an ion beam 12, through suitable analyzing, accelerating and focusing apparatus (not shown), through a duct 13 into a first or work chamber 20 in which is mounted, for rotation, a work holder target disc 25 which acts to scan the ion beam. Extending through a second chamber within housing 40, which is in fluid communication with first chamber 20, is disc drive shaft means which effects both rotation and reciprocation of the disc so as to thereby vary the location of the impinging ion beam 12 from the ion source 11 onto semiconductor wafers 14 positioned in nest arrangements within the disc. The reciprocative motion acts to gradually move the disc in the vertical plane while the rotation motion acts to move the disc generally in the horizontal plane such that workpieces (e.g. semiconductor wafers) are completely scanned by the ion beam.

Drive means for the drive shaft within housing 40 forms part of a third chamber which is isolated from the second chamber, as by a flexible wall, as more particularly illustrated in the above-cited U.S. Pat. No. 3,983,402 to Arndt, Jr. Since the details of the interworkings of the drive means are not necessary for an understanding of the cooling arrangement in accordance with the principles of the present invention, no further reference will be made thereto.

In order to permit the semiconductor wafer loading and unloading of rotating target disc 25, means are provided to withdraw the disc from first chamber 20. To this end, and as illustrated schematically in FIGS. 1 and 2, chamber withdrawal and displacement means 80, coupled to housing chamber 40, first serves to separate the first chamber 20 from the second chamber within housing 40 as along shaft 81, and supported by supplemental guide shafts 82 and 83, and then serves to rotate, as about pivot 84, the housing 40 and thus the second chamber within the housing into an upright position, such as shown in FIG. 1. As is apparent, this acts to expose the semiconductor wafers for removal and subsequent loading.

It should be noted that when first chamber 20 is in confronting and abutting relationship within the second chamber within housing 40 and the apparatus is in operation, it is preferable that both the first and second chambers be subjected to sub-atmospheric pressure (e.g. a vacuum). The vacuum may, typically, be drawn through a rough vacuum line 15 which is separated from a high vacuum line 16 by gate valve 17 to maintain the "upstream" portion of duct 13 under a high vacuum even though the first and second chambers may be opened. After the rough vacuum has been drawn, then gate valve 17 may be opened and the system stabilized so that both the first and second chambers are rather high vacuum.

However, when the ion bombardment or implantation has been completed, and it is desired to withdraw the disc from the first chamber 20, and as by the withdrawal means 80, it is necessary that the vacuum in at least the first chamber 20 be broken so as to permit withdrawal of the rotating disc from the chamber. To this end, an air vent 18 may first be connected to a suitable nitrogen source to purge the system and pressurize the first chamber so as to permit such withdrawal.

Diaphragm or check valve 90 is employed to inhibit the loss of sub-atmospheric pressure or vacuum within the second chamber in housing 40 when the vacuum in first chamber 20 is broken during the load/unload cycle. The check valve acts to isolate the second chamber from the first chamber through the differential pressure created between chambers. By such an arrangement, the pumpdown time of the second chamber is reduced thereby by reducing process time. FIG. 1 shows check valve 90 in the closed position sealing the second chamber from the atmosphere, valve 93 acting to sustain the vacuum within this chamber.

Figure 3:
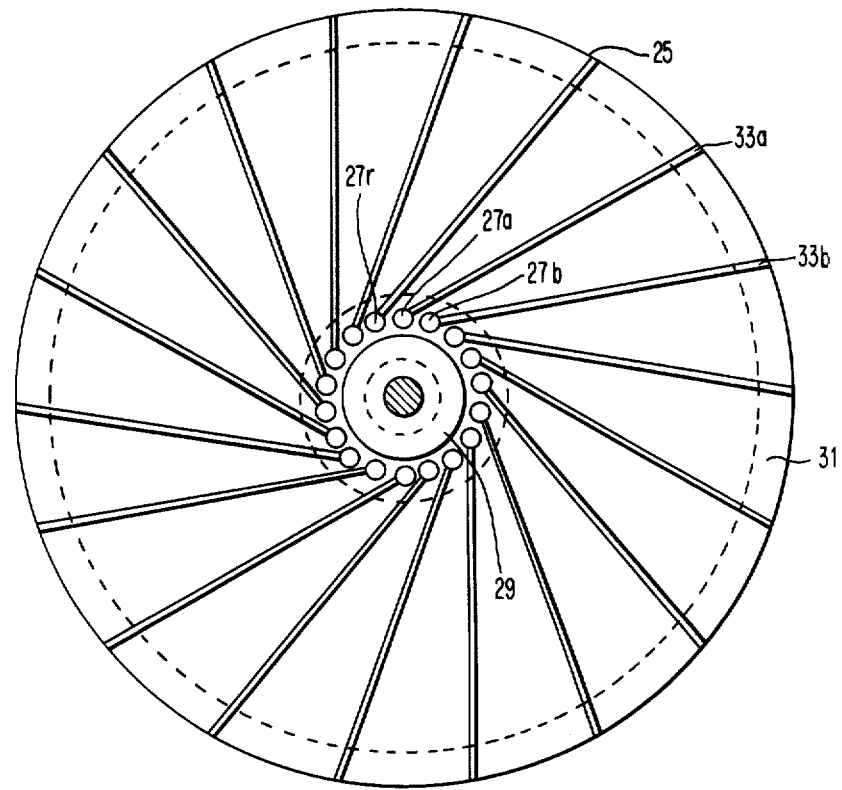
FIG. 3 shows an enlarged view of the rotating target disc shown in FIGS. 1 and 2, seen from the back side of the disc with cooling fins and air openings arranged in accordance with the present invention.

FIG. 3 shows the backside of target disc 25 used in the embodiment shown in FIGS. 1 and 2. In accordance with the present invention, the disc has provided therein a series of air openings or airholes 27a-27r which act to provide an air passageway from the front surface to the back surface of the disc. As shown, the series of airholes are formed in a pattern concentric to hub 29, such that they act to minimize the cross-sectional area of the disc between hub 29 and the outer working region 31 of the disc. Typically, the airhole arrangement reduces the disc cross-section by a factor of approximately 8. In addition to airholes, the disc is provided with a series of air fins or blades 33a-33r which originate at the respective airholes adjacent the hub region and extend outwardly to the periphery of the disc. As can be seen, the air fins are arranged to form a turbine-like structure which acts when spinning to draw air particles through the holes from the front surface of the disc and project them out over the back surface to the periphery of the disc.

Figure 4:
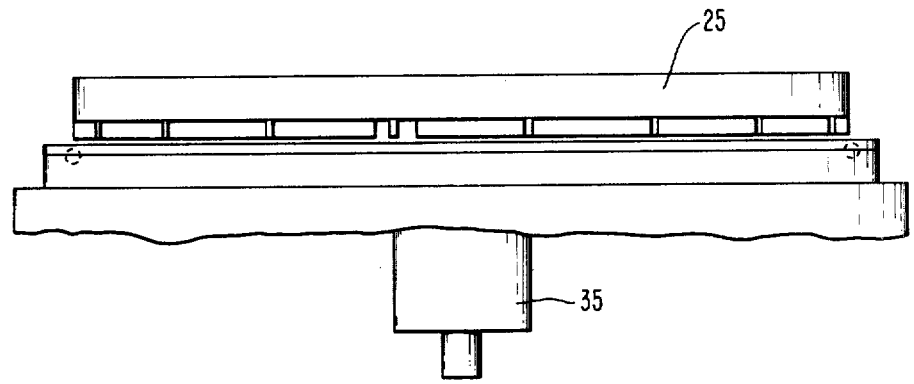
FIG. 4 shows an enlarged side view of the target disc with ferrofluidic drive means coupled to the hub thereof.

FIG. 4 shows a side view of disc 25 as mounted on drive shaft means 35 which includes a ferrofluidic rotary shaft feedthrough means. Ferrofluidic feedthrough means, typically, may comprise a conventional rotary vacuum shaft seal arrangement which may be purchased from Ferrofluidics Corp., Middlesex Turnpike, Burlington, Mass., Part No. SB-375-C-N-103. Such a sealing arrangement acts to seal the motor compartment from the second chamber within housing 40. By reducing the cross-sectional heat conductive path between the outer target area working region 31 and the hub region 29, heat transfer to the hub region is minimized and, therefore, heat transfer to the ferrofluidic feedthrough means coupled to the hub region is reduced, thereby increasing the ferrofluidic feedthrough means lifetime.

Figure 6:
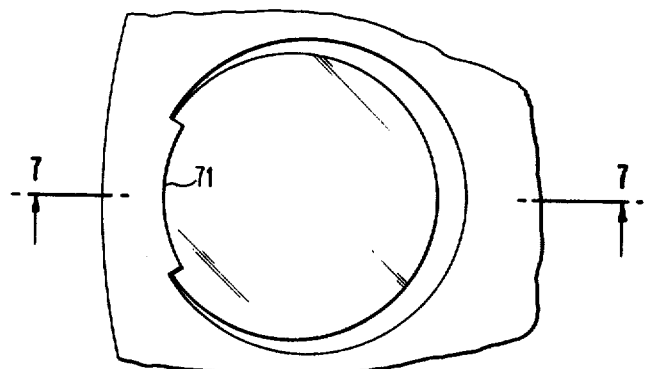
Figure 7:
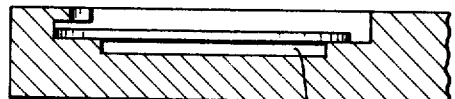
FIG. 7 shows a cross-section of the nest arrangement depicted in FIG. 6.

In a typical mode of operation, the disc spinning at 2,000 rpm's draws air particles through holes 27a-27r and forces them by fins 33a-33r over the back surface of the disk at a high rate of speed, thereby causing the disc to cool down rapidly. In the normal sequence of operation, semiconductor wafers are loaded onto disc 25 when the disc is in the position depicted in FIG. 1. Although there are any of a variety of arrangements for mounting semiconductor wafers on disc 25, typically the disc may be provided a series of nests in a pattern arranged over the target area of the front side of the disc. FIG. 6 shows a particular nest arrangement wherein semiconductor wafers may be readily dropped within the nest. As shown, lip segment 71 extends over a portion of the nest at the outer periphery of the disc. Thus, when the disc commences to spin, the wafer is, by centrifugal force, thrown out beneath the lip 71, such that it is held in place when the disc is moved to the vertical position for ion bombardment or implantation. As shown in FIG. 7, recess 73 is provided within the wafer nest to equalize the pressure on both sides of the wafer during pumpdown and venting.

After the semiconductor wafers have been positioned within the respective nests, the apparatus is positioned, as hereinabove described, to the confronting position with ion bombardment source 11, as shown in FIG. 2. As the ion beam strikes the target region of the disc containing the semiconductor wafers during the ion bombardment or implant cycle, the temperature of the target region begins to rise. It should be noted that the disc functions, in accordance with the principles of the present invention, as a heat sink or storage device during wafer processing. Thus, with the cooled disc and wafers repositioned for processing, the relatively large disc mass absorbs heat during bombardment and implantation acting as a heat sink to the wafers until thermal equilibrium is reached.

When the ion bombardment or implant cycle is completed, the series of steps hereinabove described take place wherein the disc is moved to the horizontal position for unloading the processed wafers and reloading new wafers, as shown in FIG. 1. However, as by the preferred mode prior to unloading the wafers, the disc with stored heat is made to continue to spin at approximately 2,000 rpm's so as to rapidly cool the disc via the turbine-like air cooling effect, as hereinabove described. After the cooling of the disc, the processed wafers are unloaded and new wafers loaded. The disc then commences rotation before being repositioned for wafer processing and the cycle begins anew. It is clear that the cooling step may be undertaken at different points in the unload/load operating cycle as, for example, after unloading processed wafers.

Figure 5:
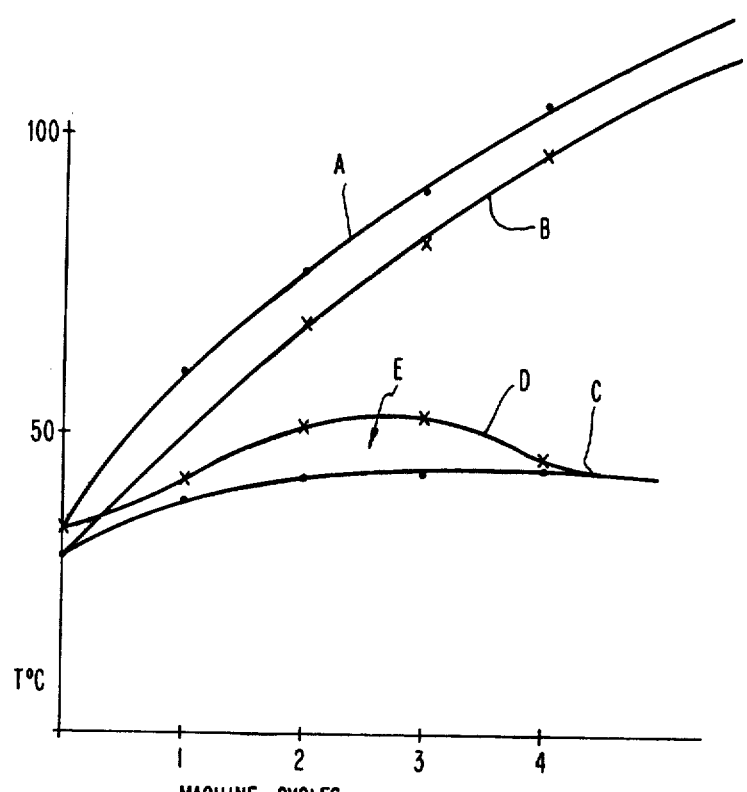
FIG. 5 shows plots of temperature characteristics taken over successive machine cycles which depicts temperature change with the use of air openings and cooling fins as compared to temperature change without using air openings and cooling fins.

The significance of the aerodynamic cooling operation between implant cycles may more readily be appreciated by reference to FIG. 5. Curve A shows the temperature rise of a standard disc without airholes or cooling fins after 4 machine cycles of operation. Curve B shows the temperature rise in the ferrofluidic feedthrough after 4 macine cycles of operation when a standard disc with no holes or fins is employed. Curve C shows the temperature rise in a cooled disc, i.e. a disc with airholes and cooling fins which operates during unload/load to cool the disc between machine processing cycles, in accordance with the principles of the present invention. Curve D shows the temperature rise in a ferrofluidic feedthrough which is coupled to a cooled disc, in accordance with the principles of the present invention. The region E between curve D and curve C represents heating due to internal mechanical friction.

Thus, it can be seen that after 4 machine cycles, a temperature delta of 64° C. is obtained using the arrangement in accordance with the present invention. Substantial temperature deltas within the wafer themselves have been found using the apparatus and process in accordance with the present invention. For example, wafers loaded on a target disc which had been cooled between each implant cycle (at 40° C.) were run through a typical emitter implant cycle. The wafers reached a maximum temperature of 230° C. Wafers were then loaded on an uncooled conventional target disc (105° C.) and the same implant process was repeated. This time the wafers reached approximately 255° C. As is clear, the higher temperature is a result of the heat transfer from the heated disc to the wafer.

While the invention has been particularly shown and described with reference to the preferred embodiment thereof, it will be understood by those skilled in the art that various changes in form and detail may be made therein without departing from the spirit and scope of the invention.

Having thus described my invention, what I claim as new, and desire to secure by Letters Patent is:

1. Cooled target apparatus for holding workpieces for ion bombardment and implantation comprising:
   a disc having a target surface and back surface and having an inner hub region and an outer target surface region with said inner hub region and outer target region being divided by a pattern of holes generally concentric to the hub region for reducing the conductive cross-section between hub region and target region and for allowing fluid to pass from the target surface side of said disc to the back surface side thereof, said back surface side of said disc including a pattern of fins extending from said inner hub region outwardly toward the periphery of said disc so as to cause said fluid to be drawn through said holes when said disc is rotating.

2. The apparatus as set forth in claim 1 wherein the said target surface of said disc includes a pattern of recesses for holding said workpieces for ion bombardment and implantation.

3. In an ion beam bombardment and implantation apparatus having at least one ion source for providing an ion beam to workpieces mounted within the work area of a target disc, the improvement comprising a target disc including a work surface side and a back surface side and having an inner hub region and an outer target region with said inner hub region and outer target region being divided by a pattern of holes generally surrounding the hub region for reducing the conductive cross-section between hub region and target region and for allowing fluid to pass from the work surface side of said disc to the back surface side, said back surface side of said disc further including a pattern of fins extending generally from said hub region outwardly toward the periphery of said disc so as to cause said fluid to be drawn through said holes when said disc is rotating.

4. The apparatus as set forth in claim 3 wherein said workpieces are respectively mounted within said work area via a pattern of recesses in said target disc.

5. A process for cooling the target of an ion bombardment and implantation apparatus to prevent progressive thermal buildup in said target with each processing cycle of operation comprising:
   rotating said target in atmosphere after each ion bombardment and implantation operation to cause air to be drawn through air openings in said target through the action of a pattern of air fins and be directed over the surfaces thereof to cause said target to be rapidly cooled thereby.

6. A process for cooling the target of an ion bombardment and implantation apparatus to prevent large thermal buildup in said target over successive cycles of operation, comprising:
   removing a heated target from the ion bombardment and implantation confronting position and positioning said target in atmosphere;
   rotating said heated target in atmosphere to cause air to flow outwardly over the surfaces thereof through the action of a pattern of air fins drawing said air through a pattern of holes around the axis of rotation so as to thereby cause said target to rapidly cool; and
   repositioning said cooled target with new workpieces to said ion bombardment and implantation position wherein said cooled target functions as a heat sink to said workpieces during ion bombardment and implantation thereof.

7. The process as set forth in claim 6 wherein said step of rotating said target in atmosphere occurs prior to unloading from said target processed workpieces and loading thereon said new workpieces.

8. The process as set forth in claim 7 wherein said step of rotating said target comprises rotating said target at approximately 2,200 rpm's.

9. Target apparatus for holding workpieces for ion bombardment and implantation comprising:
   disc means having a target surface and back surface and having an inner hub region and an outer target region with said inner hub region and outer target region being divided by a pattern of air passages generally concentric to the hub region for reducing the conductive cross-section between hub region and target region and for allowing air to pass from the target surface side of said disc means to the back surface side thereof, said disc means further including a pattern of air fins extending generally from said hub region outwardly toward the periphery of said disc means so as to cause air to be drawn through said air passages when said disc means is rotating in atmosphere.

10. In an ion bombardment and implantation apparatus for ion bombarding and implanting workpieces supported by a rotating target means, the improvement comprising:
    disc means for supporting said workpieces having a target surface and back surface and having an inner hub region and an outer target region with said inner hub region and outer target region being divided by a pattern of airholes generally concentric to the hub region for reducing the conductive cross-section between hub region and target region and for allowing air to pass from the target surface side of said disc means to the back surface side thereof,
    said disc means further having a pattern of air fin means extending generally from said hub region outwardly toward the periphery of said disc means so as to cause air to be drawn through said airholes when said disc means is rotating in atmosphere;
    control means for positioning said disc means in atmosphere; and
    means to rotate said disc in atmosphere for cooling.

* * * * *